(12) United States Patent
Ryu et al.

(10) Patent No.: US 7,834,378 B2
(45) Date of Patent: Nov. 16, 2010

(54) SCR CONTROLLED BY THE POWER BIAS

(75) Inventors: Junhyeong Ryu, Icheon (KR); Taeghyun Kang, Icheon (KR); Moonho Kim, Shiheungi-si (KR)

(73) Assignee: Fairchild Korea Semiconductor Ltd, Geonggi-Do (KR)

( * ) Notice: Subject to any disclaimer, the term of this patent is extended or adjusted under 35 U.S.C. 154(b) by 599 days.

(21) Appl. No.: 11/846,231

(22) Filed: Aug. 28, 2007

(65) Prior Publication Data

US 2009/0057715 A1    Mar. 5, 2009

(51) Int. Cl.
*H01L 29/74* (2006.01)
*H01L 23/62* (2006.01)
(52) U.S. Cl. .................. 257/173; 257/175; 257/355
(58) Field of Classification Search ......... 257/173–176, 257/355, E29.211, E29.008, E29.015
See application file for complete search history.

(56) References Cited

U.S. PATENT DOCUMENTS

| 5,576,557 | A |   | 11/1996 | Ker |           |
|-----------|---|---|---------|-----|-----------|
| 5,610,425 | A |   | 3/1997  | Quigley |       |
| 5,663,860 | A |   | 9/1997  | Swonger |       |
| 5,671,111 | A |   | 9/1997  | Chen |          |
| 5,754,381 | A |   | 5/1998  | Ker |           |
| 5,905,288 | A |   | 5/1999  | Ker |           |
| 6,147,369 | A | * | 11/2000 | Chen et al. ............ 257/173 |
| 6,246,079 | B1 |  | 6/2001  | Chen |          |
| 6,353,237 | B1 |  | 3/2002  | Yu |            |
| 6,661,060 | B2 | * | 12/2003 | Lee et al. ............. 257/355 |
| 6,844,595 | B2 |  | 1/2005  | Fan-Chen |     |
| 7,719,026 | B2 | * | 5/2010  | Lou et al. ............ 257/173 |

* cited by examiner

*Primary Examiner*—Cuong Q Nguyen
(74) *Attorney, Agent, or Firm*—Edwin H. Paul, Esq.

(57) ABSTRACT

A composite dual SCR circuit that acts to protect the Vcc node as well as an I/O node or pin. The dual SCR uses the Vcc to control or program the triggering point of the SCR connected to an I/O node. When Vcc is low, the SCR protecting an I/O node triggers a few volts above ground, but when Vcc is high the trigger point of the SCR protecting the I/O node is much higher. The dual SCR incorporates added diffusions to an existing first SCR structure between the power node and the ground node thereby forming a second SCR. The first and second SCRs share a common cathode transistor. In one illustrative embodiment, only one SCR is constructed incorporating the Vcc to control the triggering of the SCR.

9 Claims, 4 Drawing Sheets

LAYOUT

CURRENT-VOLTAGE CURVES OF I/O PIN (34)

SCR CONTROLLED BY THE POWER BIAS

BACKGROUND OF THE INVENTION

1. Field of the Invention

The present invention relates to circuit protection from ESD (Electro Static Discharge, and more particularly to use of SCRs (Silicon Controlled Rectifiers) to protect against ESD events and latch up.

2. Background Information

Conventional ESD protection devices and methods include SCRs coupled across I/O (input/output) nodes that are directly coupled to the external environment and, thus, susceptible to external influences. Such SCRs are also connected across nodes that connect to power supplies. The protecting SCR, when positioned across two nodes (one node typically being ground), will present an open circuit to node voltages (meaning the voltage difference between the two nodes) less than the trigger or breakdown voltage of the SCR. When triggered by a voltage above the trigger voltage the SCR presents a low impedance across the pins as long as the node voltage is above the holding voltage of the SCR. Past emphasis has been placed on making the SCR trigger quickly so that any high voltage ESD event is shunted quickly not reaching a voltage that may damage the electronics.

Herein the words "connect" and "couple" are interchangeable and defined herein as "functionally connected," meaning other components may or may not be used in the connection.

Typically systems using SCR protection include electronic circuit(s) mounted to a PCB (printed circuit board) with nodes (pins) that connect to power supplies and to (I/O) external systems. Pins or nodes are both defined herein to mean all the various types of connections of a system that connect to the external environment. They are interchangeable herein.

Conventional SCR's are placed across nodes to protect against ESD events. These SCRs are selected with a protection window that defines a high voltage, greater than the operating voltage of the node but below the maximum voltage for the node, and a low holding voltage. The SCR is designed to trigger at the high window voltage and turns off when the voltage lowers below the low holding voltage. For example, an ESD event often is an ungrounded human coming in contact with a node where several thousands volts of static electricity may contact the node. When a typical ESD event occurs the protecting SCR triggers maintaining a low voltage on the node and dissipating the ESD. When the node voltage falls below the low holding voltage the SCR turns off again presenting a high impedance across the node.

Damage to devices typically can be described as a catastrophic voltage breakdown of an oxide layer that destroys the device or as latch up where a device unexpectedly remains turned on. Latch up draws current from the external system and may not destroy the device if the current is limited. As the NMOS devices get smaller, latch up becomes more of an issue. Latch up typically involves parasitic bipolar transistors. These transistors are biased off, but when stressed by over voltage, heat, radiation, etc. the PN junctions may become forward biased in a regenerative manner and draw excessive current. The circuit does not function as designed, but as mentioned above the device may not be damaged.

Generally nodes that that connect to power supplies, e.g., Vcc, are more susceptible to latch up while I/O pins are more susceptible to ESD voltage breakdowns. It would be advantageous to have an SCR protective device across power supply node with a triggering voltage substantially higher (a large gap) that the power supply voltage to protect against latch up. At the same time it would be advantageous to provide an SCR with a triggering voltage only a little above (small gap) the operating voltage of an I/O pins to protect against ESD breakdown and to minimize I/O node leakage. The small gap facilitates these conditions.

Moreover, when a circuit is unpowered, it would be advantageous to still protect the circuit by triggering the protective device (SCR) at a low, e.g. one volt, triggering threshold.

SUMMARY OF THE INVENTION

The issues discussed above regarding SCR protection circuits connecting to nodes or pins on a PCB is addressed in an embodiment of the present invention that employs the power supply voltage, Vcc, as a control for the SCR protecting an I/O pin at a trigger voltage only a little higher than the operating voltage of the I/O node. In such an embodiment, when the circuit is powered and Vcc is high, Vcc biases the SCR protecting an I/O pin to provide a triggering voltage about equal to the operating voltage of the pin plus the Vcc supply voltage. In this example the Vcc biases the trigger voltage for the SCR protecting an I/O pin. For example, if the operating voltage of an I/O pin is about +15V and the Vcc was +20V, the SCR protecting that I/O pin might be set at about one diode drop higher than the Vcc level, or about +21V. The +6V difference between +15V and +21V provides a clamp for a ESD event, and the +6V reverse bias negates leakage in the I/O pin.

In addition, the present invention also provides a single composite SCR protective device that protects two nodes, illustratively a power supply node and an I/O node. The composite SCR adds diffusions beside a first SCR IC (integrated circuit) structure between the power supply node (Vcc) and ground. The composite SCR is a partial dual structure where cathode of the first SCR is also the cathode of the second SCR. In operation illustratively the power node is protected against latch up while Vcc acts as a controller for the SCR that protects I/O nodes.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
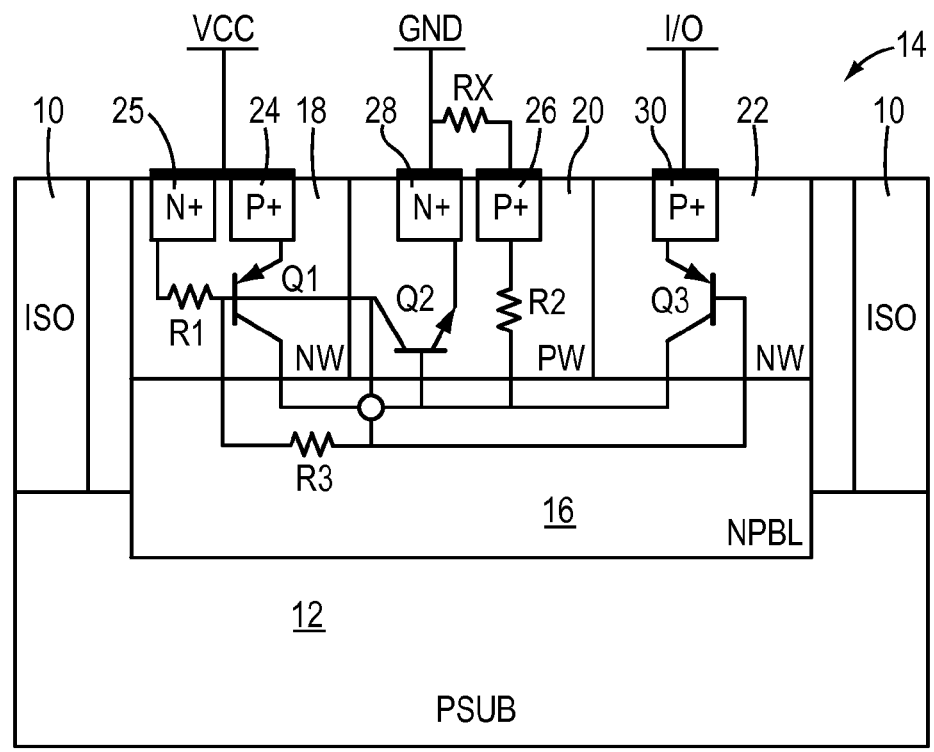
FIG. 1 is a schematic representation of an integrated circuit embodiment of the present invention.
Figure 2:
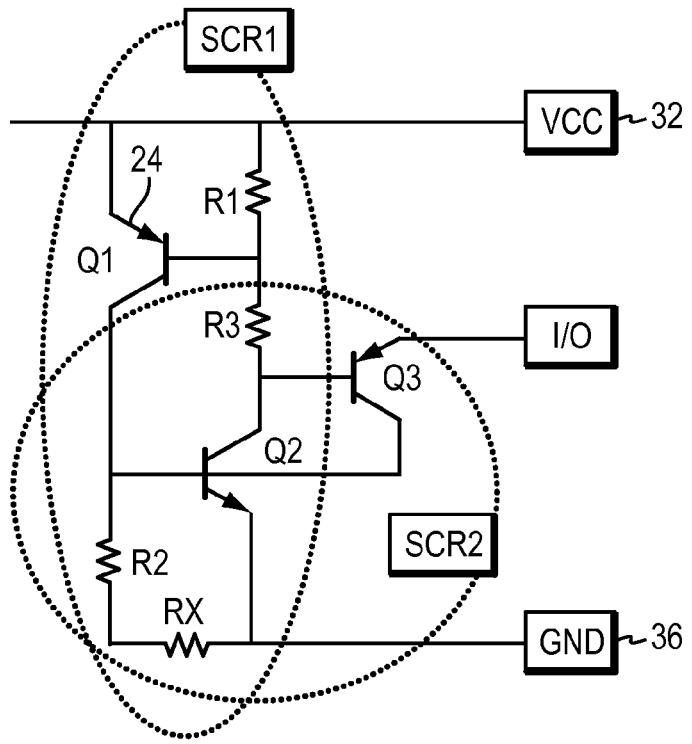
FIG. 2 is a clean schematic of FIG. 1.

FIG. 1 shows an IC (integrated circuit) composite dual SCR and FIG. 2 is an equivalent circuit schematic. The dual SCR 14 shares a common circuit element, the NPN bipolar transistor Q2 of FIG. 2.

FIG. 1 shows isolation diffusions, ISOs 10, that connect to the P-type substrate 12 and isolate the dual SCR 14. An NPBL (N+-type buried layer) 16 underlies the dual SCR. Two NW 18 and 22 (N-type Wells) wells are formed on either side of a P+ well 20 that penetrates to the NPBL 16. A P+ electrode 24 is diffused in the NW 18 to form the emitter of PNP Q1. Q1 base is brought to an N+ electrode 25, and the base and the emitter of Q1 are connected together and tied to Vcc. An inherent resistor R1 exists in the base connection since the N-type structure 18 is not highly doped. The collector of Q1 connects via the NPBL 16 to the P+ electrode 26 in the P-type structure 20 through the resistance R2.

The base of Q1 also forms the collector of the NPN Q2, and the NPBL 16 forms the base of Q2 and the collector of PNP Q3. The emitter of NPN Q2 comes out via the N+ electrode 28. The P+ electrode 26 is connected to the N+ electrode 28 with a high value resistor Rx. The value of Rx may be used to set the holding voltage of the dual SCR.

The PNP Q3 is formed in the P-type structure 22. Its emitter is brought to a P+ electrode 30, and the NPBL forms the base The resistor R3 connects the base of Q3 to the Base of Q1. The collector is P-type structure 20.

FIG. 2 is a circuit schematic illustration of the structure of FIG. 1. Two SCR's are shown, SCR1 and SCR2. SCR1 comprises Q1 and Q2 and SCR2 includes Q3 and shares Q2. An SCR is generally depicted as a four layer, three terminal device. With respect to SCR1 the four layers are the emitter of Q1, the base of Q1 (which is also the collector of Q2), the collector of Q1 and the emitter of Q2. The three terminals are the anode, the gate (trigger) and the cathode. For SCR1 the anode is the emitter of Q1 protecting the Vcc terminal, the trigger is the base of Q1 or Q2 and the cathode is the emitter of Q2. For SCR2 the anode is the emitter of Q3, the gate is the base of Q2 or Q3 and the cathode is the emitter of Q2. Clearly, the dual SCR structure is a composite with the shared Q2, and the Vcc voltage level at the base of Q1 and the base of Q3 affects the triggering of SCR1 and SCR2.

The SCR1 is not triggered by directly driving the base of Q1 or Q2. In this case Q1/ and Q2 are designed so that leakage currents will occur when the Vcc node is at a designed voltage. For example, leakage via the base/collector of Q1 will be partially determined by Rx. When leakage current increases the base voltage of Q2, it turns on. Q2 collector current will turn on Q1 which will latch SCR1.

SCR2 is also not triggered by directly driving the bases of Q3 or Q2. When Vcc is low (and presumably a low impedance to ground) I/O node 34 will be turned on at about +1V. This will, in turn, drive the base of Q2 turning Q2 on which, in turn, causes SCR2 (Q3 and Q2) to latch. With Vcc is at its on voltage level, Vcc will appear at the base of Q3. When the emitter of Q3, node 34, rises to a diode drop above Vcc, say due to an ESD event, SCR2 will turn on, holding the voltage at node 34 low.

When the circuit is powered and Vcc is high, Vcc will appear at the base of Q3. When the emitter of Q3, node 34, rises to a diode drop above Vcc, say due to an ESD event, SCR2 will trigger, holding the voltage at node 34 low. Note that the voltage level of Vcc controls the turning on and off of Q3 via the NPBL 16 of FIG. 1.

When Vcc is high SCR2 triggers at a voltage that is a little higher than the typical operating voltage of each I/O pin. This small trigger voltage gap protects the I/O pins from destructive ESD breakdowns. When Vcc is high, SCR1 triggers at a much higher voltage than Vcc and avoids latch up problems in the devices connected to the Vcc.

Figure 3:
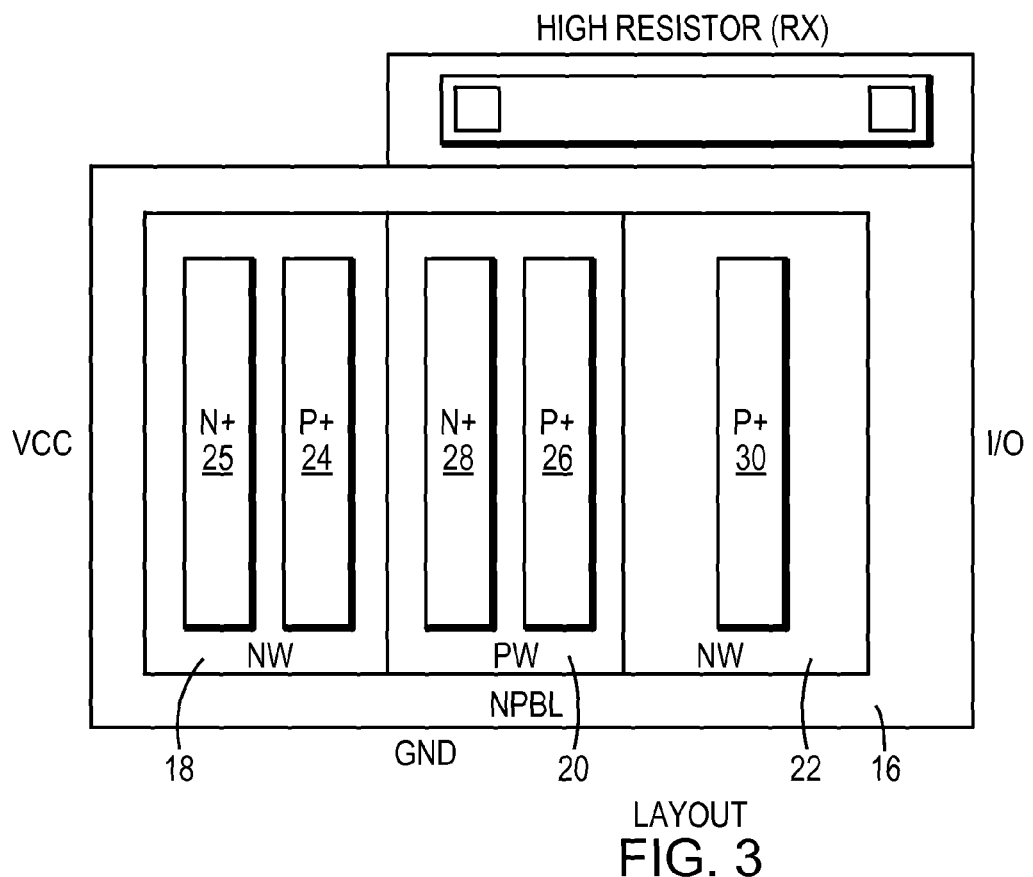
FIG. 3 is a top view of a layout of an embodiment of the present invention.
Figure 4:
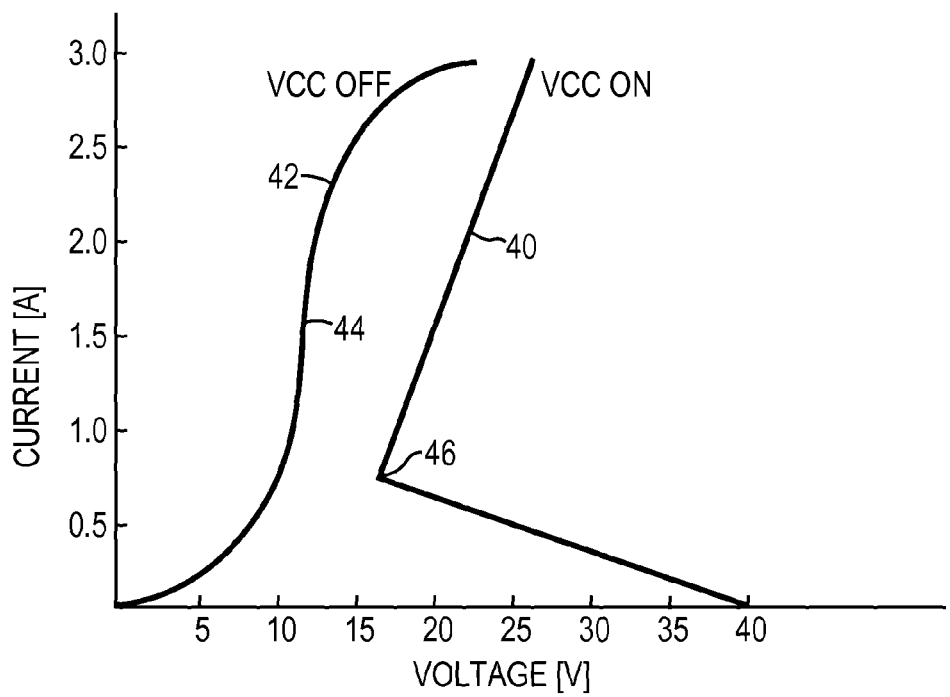
FIG. 4 is a chart illustrating the functions of a device made in accordance with the present invention.

FIG. 3 is a representative top view of a layout for the circuit of FIGS. 1 and 2. FIG. 4 illustrates the protection of an I/O pin with power on 40 (Vcc high) and power off 42 (Vcc low). The design allows both to support an ESD current of about 3 A in the same effective physical IC structure width.

With respect to FIG. 4 and the I/O node 34, when Vcc is off curve 42 shows the current increase starting from about 2.5V. The emitter to base of Q3 is turning on. Q2 eventually turns on re-generatively latching I/O node 34, illustratively to about 12V with a low or slightly negative resistance characteristic 44. If additional current is available the voltage increases due to resistive effects. When Vcc is on, Q3 turns on when it is at a diode drop volts above Vcc, Q3 and Q2 regeneratively latch dropping the node 34 voltage 46 to about 16V.

Generally power pins are not as sensitive to ESD events, but are sensitive to latch up conditions. SCR1 triggers at a much higher voltage than Vcc to protect the power pins from latch up. Here the low voltage of the SCR1 window is higher than the latch up voltage by design.

The I/O pins are sensitive to ESD stresses, but not latch up. The small (1-2V) gap between the operating voltage of the I/O pins (e.g., about Vcc) and the trigger voltage of the I/O pins protects the pins from ESD. The small gap is just the voltage that forward biases the emitter/base of Q3. In this design SCR2 will start to turn on when the emitter of Q3 rises above its base, but its base is biased to Vcc. Therefore, the trigger threshold of SCR2 is higher than but directly tied to the Vcc voltage. Q3 collector current travels through the NPBL 16.

Figure 5:
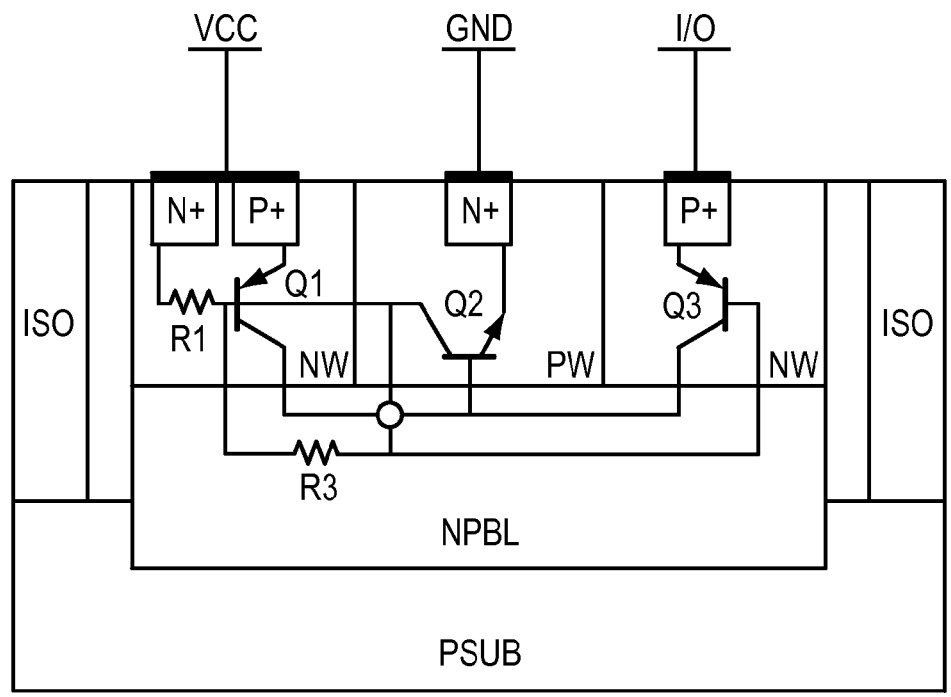
FIG. 5 is a schematic representation of an integrated circuit embodiment of the present invention.
Figure 6:
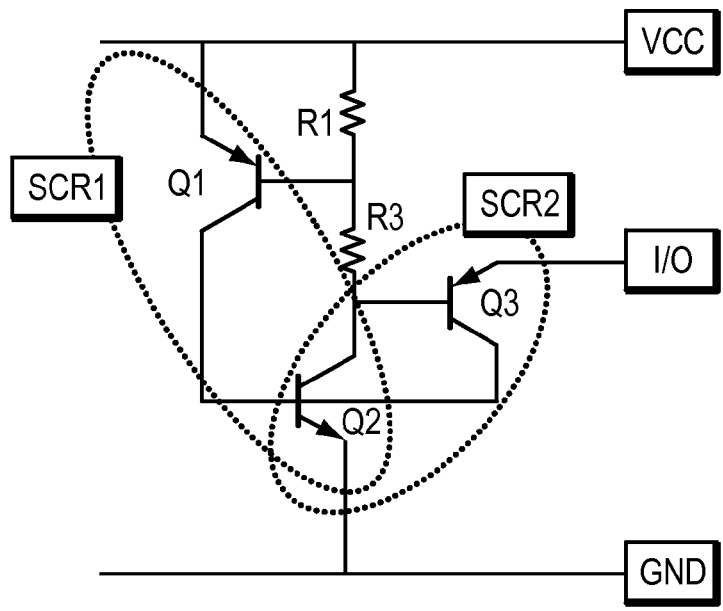
FIG. 6 is a schematic of the circuit of FIG. 5.

FIG. 5 is another illustrative embodiment and FIG. 6 is the equivalent schematic. Compared to FIGS. 1 and 2, the P+ electrode 26, R2 and Rx are omitted. In this design the trigger levels will be lower than those in FIG. 1, but the circuit operations are similar to those described above for FIG. 1.

Figure 7:
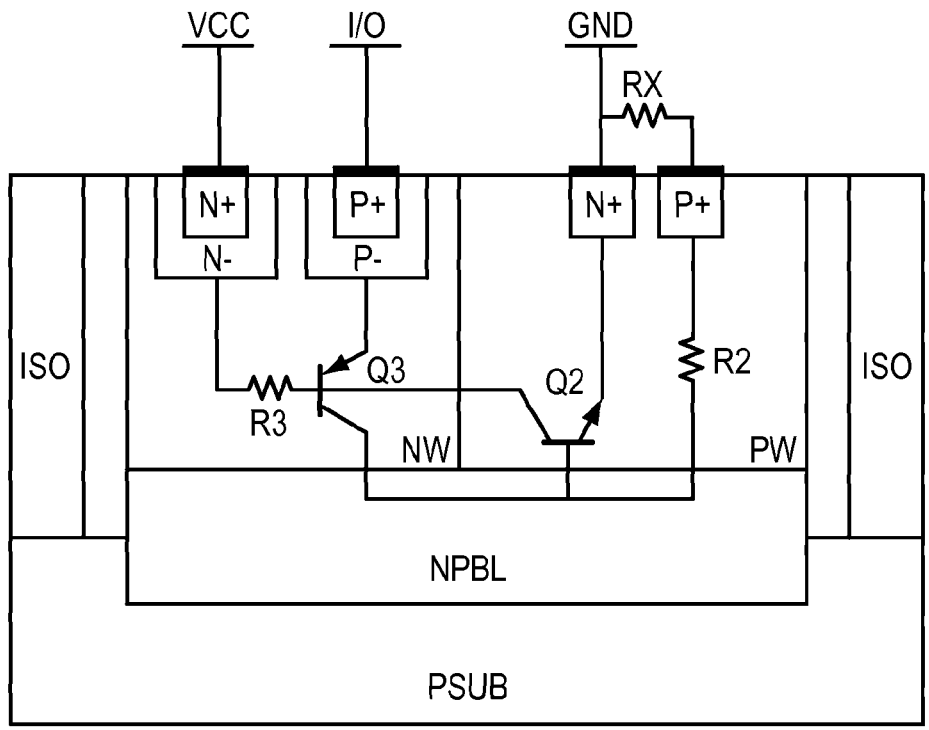
FIG. 7 is a schematic representation of a integrated circuit embodiment of the pre-sent invention.
Figure 8:
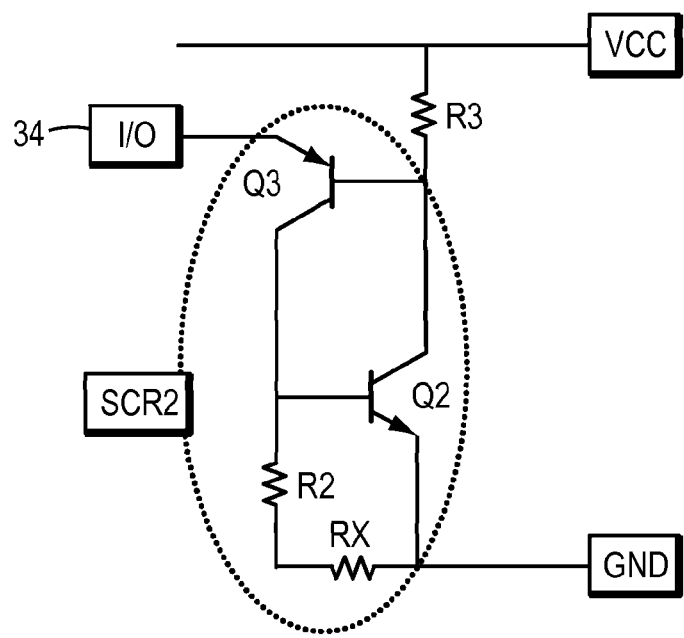
FIG. 8 is a schematic of the circuit of FIG. 7.

FIGS. 7 and 8 are another illustrative embodiment of the present invention. Here Q1 is omitted. In this embodiment, the I/O pin 34 is protected by SCR2 (Q3 and Q2). Vcc still biases the base of Q3 and participates in the protection of I/O pin 34 when Vcc is on or off. Vcc has some protection via R3 and the breakdown of the base collectors of Q2 and Q3. If Vcc rises Q2 will eventually turn on holding Vcc at some level partially determined by R3.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An SCR, defining a trigger voltage, functionally connected between a first node to be protected and a second node, the SCR comprising:
   a PNP transistor with its emitter functionally connected to the first node;
   a first resistor coupling the base of the PNP transistor to a voltage source;
   an NPN transistor with its collector functionally connected to the base of the PNP transistor, its base connected to the collector of the PNP transistor, and its emitter functionally connected to the second node, wherein the PNP and NPN comprise the protective SCR, and wherein the voltage source biases the base of the PNP transistor and thereby controls the trigger voltage of the SCR.

2. The SCR, demonstrating a holding current, of claim 1 further comprising:
a second resistor connecting the base to the emitter of the NPN transistor that determines the holding current.

3. The SCR of claim 1 further comprising:
a second PNP transistor with its emitter connected to the power source, its base to the base of the PNP transistor, and its collector to the base of the NPN transistor, wherein the second PNP and the NPN transistors constitute a second SCR, wherein the second SCR protects the power source node.

4. The SCR of claim 3 further comprising a third resistor arranged one series with the first resistor, the third resistor connecting to the power source node, and wherein the second PNP transistor is connected to the junction of the resistor and the third resistor.

5. The SCR of claim 4 further comprising a fourth resistor connecting the base to the emitter of the NPN transistor that determines the holding current of both SCRs.

6. A dual SCR, the dual SCR arranged functionally to protect both a voltage source and a first node, and a second node, the dual SCR defining a first trigger voltage for the first node and a second trigger voltage for the voltage source, the dual SCR comprising:
a PNP transistor with its emitter functionally connected to the first node;
a first resistor coupling the base of the PNP transistor to the voltage source;
a first NPN transistor with its collector functionally connected to the base of the PNP transistor, its base functionally connected to the collector of the PNP transistor, and its emitter functionally connected to the second node;
a second PNP transistor with its emitter functionally connected to the voltage source, its collector functionally connected to the base of the NPN transistor, and its base functionally connected to the collector of the NPN transistor, wherein the voltage source biases the trigger voltage of the first node.

7. The dual SCR of claim 6 wherein the first PNP and the first NPN define a circuit that triggers when the first node reaches the first trigger voltage, and wherein the second PNP and the first NPN define a second trigger circuit that triggers when the voltage source reaches the second trigger voltage.

8. A protective SCR functionally connected between a node to be protected and a second node, the SCR comprising:
an N well and a P well overlaying an N buried layer,
a first N+ tub and a first P+ tub formed in the N well; the first N+ tub coupled to a node connecting to a power source; the P+ tub functionally connecting to the node to be protected;
a second N+ tub and P+ tub formed in the P well; the second N+ tub functionally connected to the second node,
a resistor that functionally connects the second P+ tub to the second node;
the first P+ tub, the first N+ tub and N buried layer, and the P well forming a bipolar PNP transistor,
the N well, the P well and the second N+ tub forming a bipolar NPN transistor, wherein functionally the collector of the bipolar PNP connects to the base of bipolar NPN, and functionally the base of the bipolar NPN connects to the collector of the bipolar NPN, the bipolar PNP and NPN arrange in a regenerative latching configuration; and wherein the power source controls the voltage level on the node to be protected that triggers the regenerative latching of the bipolar NPN and PNP.

9. The protective SCR of claim 8 further comprising a low doped N well formed around the first N+ tub and a low doped P well formed around the first P+ tub, the low doped wells arrange to increase the breakdown voltage between the node to be protected and the node functionally connected to the power source, the breakdown voltage of the base to emitter of the bipolar PNP.

* * * * *